(12) United States Patent
Leslie et al.

(10) Patent No.: US 11,942,404 B2
(45) Date of Patent: Mar. 26, 2024

(54) APPARATUSES AND SYSTEMS HAVING BALL GRID ARRAYS AND ASSOCIATED MICROELECTRONIC DEVICES AND DEVICE PACKAGES

(71) Applicant: Micron Technology, Inc., Boise, ID (US)

(72) Inventors: Matthew B. Leslie, Boise, ID (US); Timothy M. Hollis, Meridian, ID (US); Scott R. Cyr, Boise, ID (US); Stephen F. Moxham, Boise, ID (US); Matthew A. Prather, Boise, ID (US); Scott Smith, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 125 days.

(21) Appl. No.: 17/411,879

(22) Filed: Aug. 25, 2021

(65) Prior Publication Data

US 2022/0068778 A1    Mar. 3, 2022

Related U.S. Application Data

(60) Provisional application No. 63/069,865, filed on Aug. 25, 2020.

(51) Int. Cl.
*H01L 23/498*    (2006.01)
*H01L 25/065*    (2023.01)
(Continued)

(52) U.S. Cl.
CPC .. *H01L 23/49816* (2013.01); *H01L 23/49827* (2013.01); *H01L 25/0657* (2013.01);
(Continued)

(58) Field of Classification Search
CPC ............ H01L 25/0652; H01L 25/0657; H01L 25/105; H01L 2225/06562;
(Continued)

(56) References Cited

U.S. PATENT DOCUMENTS 6,388,318 B1   5/2002   Iwaya et al.
7,375,983 B2   5/2008   Djordjevic et al.
(Continued)

FOREIGN PATENT DOCUMENTS

KR    20210133832 A   * 11/2021   ........... G11C 7/1072
KR    20220018184 A   *  2/2022   ............... G11C 5/06

OTHER PUBLICATIONS

Translation of Moon, KR-20210133832-A, 2021 (Year: 2021).*
(Continued)

*Primary Examiner* — Marcos D. Pizarro
*Assistant Examiner* — William Henry Anderson
(74) *Attorney, Agent, or Firm* — TraskBritt

(57) ABSTRACT

Apparatuses, such as semiconductor device packages, may include, for example, a device substrate including a semiconductor material and bond pads coupled with an active surface of the device substrate. A package substrate may be secured to the device substrate, the package substrate configured to route signals to and from the bond pads. A ball grid array may be supported on, and electrically connected to, the package substrate. Each ball of the ball grid array positioned and configured to carry a clock signal or a strobe signal may be located in a central column of the ball grid array.

21 Claims, 10 Drawing Sheets

(51) Int. Cl.
*H01L 25/10* (2006.01)
*H01L 23/00* (2006.01)
*H01L 23/13* (2006.01)

(52) U.S. Cl.
CPC ............ *H01L 25/105* (2013.01); *H01L 23/13* (2013.01); *H01L 24/16* (2013.01); *H01L 24/48* (2013.01); *H01L 2224/16235* (2013.01); *H01L 2224/48105* (2013.01); *H01L 2224/48227* (2013.01); *H01L 2224/4824* (2013.01); *H01L 2225/06506* (2013.01); *H01L 2225/06541* (2013.01); *H01L 2225/06562* (2013.01); *H01L 2225/1058* (2013.01); *H01L 2225/107* (2013.01); *H01L 2924/14361* (2013.01)

(58) Field of Classification Search
CPC ................................ H01L 2225/06572; H01L 2021/60225–60262; H01L 2224/0651–06515; H01L 2224/0951–09515; H01L 2224/1451–14515; H01L 2224/1751–17515; H05K 2203/1572; H05K 2201/10734; G11C 7/10–1078

See application file for complete search history.

(56) References Cited

U.S. PATENT DOCUMENTS

| | | | |
|---|---|---|---|
| 9,089,060 | B1 | 7/2015 | Azeroual et al. |
| 9,907,156 | B1 | 2/2018 | Anand et al. |
| 10,455,690 | B1 | 10/2019 | Chengson et al. |
| 2003/0042623 | A1* | 3/2003 | Shiomi .................. H01L 24/49 257/E23.079 |
| 2013/0314968 | A1* | 11/2013 | Shaeffer ................. H01L 23/48 257/777 |
| 2013/0322162 | A1 | 12/2013 | Lee et al. |
| 2014/0181333 | A1 | 6/2014 | Bains |
| 2014/0264906 | A1 | 9/2014 | Fai et al. |
| 2015/0061128 | A1 | 3/2015 | Ramakrishnan et al. |
| 2015/0364447 | A1* | 12/2015 | Jung ...................... H01L 23/50 257/738 |
| 2017/0012023 | A1* | 1/2017 | Song .................. H01L 25/0657 |
| 2018/0323169 | A1* | 11/2018 | Kelly ................. H01L 25/0652 |
| 2019/0179785 | A1* | 6/2019 | Keeth .................. G06F 3/0659 |

OTHER PUBLICATIONS

Translation of Seok, KR-20220018184-A, 2022 (Year: 2022).*
Murdock, Brett, "Advantages of LPDDR5: A New Clocking Scheme," Semiconductor Engineering, Webpage, https://semiengineering.com/advantages-of-lpddr5-a-new-clocking-scheme/, accessed Jun. 30, 2021, 20 pages.

* cited by examiner

APPARATUSES AND SYSTEMS HAVING BALL GRID ARRAYS AND ASSOCIATED MICROELECTRONIC DEVICES AND DEVICE PACKAGES

CROSS-REFERENCE TO RELATED APPLICATION

This application claims the benefit under 35 U.S.C. § 119(e) of U.S. Provisional Patent Application Ser. No. 63/069,865, filed Aug. 25, 2020, the disclosure of which is incorporated herein in its entirety by this reference.

FIELD

This disclosure relates generally to techniques for configuring ball grid arrays of semiconductor device packages. More specifically, disclosed embodiments relate to ball grid arrays and associated signal routing between the ball grid arrays and connected semiconductor devices, which embodiments may improve signal quality, reduce cross-talk, enable higher-speed data transfers, and improve power distribution and delivery.

BACKGROUND

A significant purpose of microelectronic device (e.g., semiconductor die) packaging is to connect the device to higher-level packaging of an electronic system. One aspect of packaging is the translation of signals from the relatively small features (e.g., bond pads or rerouted bond pads) of the die to larger and more widely spaced connection locations of a next higher level package, such as a circuit board. One favored package configuration is the so-called ball grid array (BGA) package in which conductive traces extend from locations on one major surface of a package substrate arranged and spaced to connect to closely spaced rows of bond pads of the die (e.g., located in a generally centrally located row or rows on a major surface of the package substrate) to an array of discrete conductive elements, often in the form of solder bumps or balls, arranged in rows and columns and at greater pitches (i.e., center-to-center spacing) on an opposite major surface of the package substrate. Robust coupling between the device and higher-level packaging of a system is critical, particularly at higher signal speeds.

Signal optimization at the internal die level to support various performance aspects, such as power, latency, and internal jitter reduction, may be a function of die bond pad order to minimize data path and clock tree lengths, adequate power delivery to circuits through appropriate numbers of interspersed power and ground connections, and/or minimization of overall die size to cost reduction. However, the pattern and pitch, or "ballout," definition of the balls of a BGA are generally dictated by industry-wide (i.e., JEDEC) standards, taking into account the applications in which the microelectronic device package is expected to operate. Accordingly, opportunities for performance optimization in signal paths of the package substrate are limited. The problems of signal crosstalk attributable to signal coupling between adjacent balls is exacerbated as signal speeds increase with increasing bandwidth, clock speed increases, and ball pitch decreases. In specific examples, increasing memory capacity and operating speeds of double data rate (DDR) dynamic random access memory (DRAM) in the form of synchronous DRAM (SDRAM) and graphics double data rate (GDDR) DRAM present challenges in this regard.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
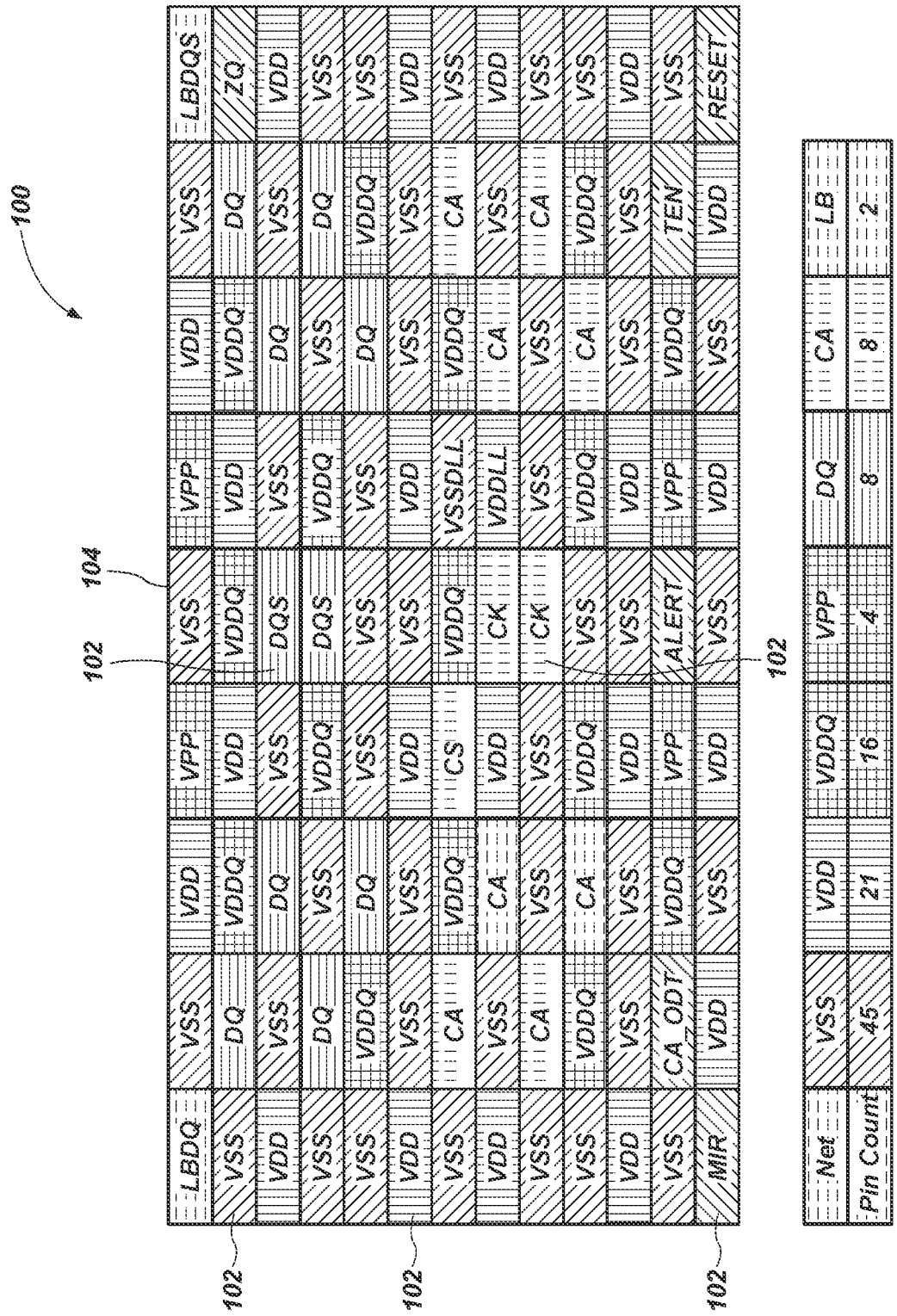
FIG. 1 is a schematic view of a ball grid array in accordance with this disclosure.

Disclosed embodiments relate generally to ball grid arrays and associated signal routing between the ball grid arrays and connected semiconductor devices, which embodiments may improve signal quality, reduce cross-talk, enable higher-speed data transfers, and improve power distribution and delivery. More specifically, disclosed are embodiments of ball grid arrays and associated signal routing between the ball grid arrays and associated semiconductor devices which may position balls of the ball grid array configured to carry a clock signal or a strobe signal in a central column of the ball grid array. For example, the ball grid array may be at least substantially reflectively symmetrical across a central column of the ball grid array, and those balls configured to carry clock signals or strobe signals may be located within the central column.

In some embodiments, ball grid arrays in accordance with this disclosure may position those balls of the ball grid array configured to carry clock signals or strobe signals distal from a perimeter of the ball grid array. For example, the perimeter of the ball grid array may be free of any balls configured to carry clock signals or strobe signals, and all balls of the ball grid array located at the perimeter of the ball grid array may be configured to carry signals other than clock signals and strobe signals, reference voltages, or connections to ground. More specifically, at least one ball (e.g., at least one row) may be interposed between any ball in the perimeter of the ball grid array and a closest ball configured to carry a clock signal or a strobe signal.

In certain embodiments, ball grid arrays in accordance with this disclosure may position those balls of the ball grid array configured to carry clock signals or strobe signals distal from balls configured to carry data signals. In addition, those balls configured to carry data signals may be positioned to reduce (e.g., eliminate) adjacency between the respective balls configured to carry data signals. For example, at least one ball (e.g., at least one column) may be interposed between any ball configured to carry a clock signal or a strobe signal and a closest ball configured to carry a data signal. As another example, those balls of the ball grid array positioned and configured to carry data signals may be located only diagonally adjacent to any other directly adjacent balls configured to carry another data signal. More specifically, those balls of the ball grid array positioned and configured to carry data signals may be located diagonally adjacent to no more than two other directly adjacent balls configured to carry another data signal.

As used herein, the terms "substantially" and "about" in reference to a given parameter, property, or condition mean and include to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

The terms "memory" and "memory device," as used herein, include microelectronic devices exhibiting, but not limited to, memory functionality, but exclude embodiments encompassing transitory signals. For example, a system on a chip (SoC) is encompassed in the meaning of memory device. By way of non-limiting example, memory devices may generally include packaged semiconductor devices having ball grid arrays and signal routing configurations as described herein, unless otherwise specified.

The terms "ball" and "balls," as used in connection with a ball grid array (or other arrayed electrical interconnect) herein, mean and include discrete masses and structures of electrically conductive material positioned and configured in an array to connect a semiconductor device package to other devices, components and structures (e.g., interposer, printed circuit board, etc.) of an electrical system. For example, the term "balls" includes solder balls or bumps, as well as other discrete conductive elements including without limitation (e.g., metal) posts, columns, pillars, studs or other shapes used for the foregoing purpose.

The terms "laterally adjacent" and "longitudinally adjacent," as used herein in connection with balls of a ball grid array, respectively mean and include, when a BGA is parallel to the plane of a drawing sheet, balls located directly to the left of, to the right of, above or below a given ball when geometrical centers of the balls in the ball grid array are at least substantially aligned in a common horizontal or vertical plane. For example, a ball in the ball grid array having balls both laterally and longitudinally adjacent may, in combination, form an at least substantial cross symbol or plus sign within an at least substantially square diamond shape utilizing lines connecting the geometrical centers of the respective balls. Laterally adjacent or longitudinally adjacent balls, pads, or elements may also be referred to as neighboring, contiguous, side-by-side, or next to one another because they may each have a side, edge or point that neighbors, is contiguous to, is side-by-side with, or is next to another ball, pad, or element without any other such element between the two.

The term "diagonally adjacent," as used in connection with a ball grid array herein, means and includes, when a BGA is parallel to the plane of a drawing sheet, balls located directly above and to the right, above and to the left, below and to the right, and below and to the left of a given ball when geometrical centers of the balls in the ball grid array are at least substantially aligned in a common oblique (i.e., diagonal) plane. For example, a ball in the ball grid array having balls diagonally adjacent to that ball in all directions may, in combination, form an at least substantial "X" shape within an at least substantially square shape utilizing lines connecting the geometrical centers of the respective balls. Diagonally adjacent balls, pads, or elements may also be to as neighboring, contiguous, side-by-side, or next to one another because they may each have a point that neighbors, is contiguous to, is side-by-side with, or is next to another ball, pad, or element without any other such element between the two.

The terms "surrounding" and "surrounded" as used in connection with a ball grid array herein, mean and include, when a BGA is parallel to the plane of a drawing sheet, balls located laterally, longitudinally, and diagonally adjacent to a given ball with geometrical centers of the balls in the ball grid array at least substantially aligned respectively with common vertical, horizontal, and diagonal planes. For example, a ball surrounded by other balls in the ball grid array may collectively form a three-by-three matrix of squares utilizing lines connecting the geometrical centers of the respective balls.

The illustrations presented in this disclosure are not meant to be actual views of any particular semiconductor device package, ball grid array, or component thereof, but are merely idealized representations employed to describe illustrative embodiments. Thus, the drawings are not necessarily to scale.

FIG. 1 is a schematic view of a ball grid array 100 in accordance with this disclosure, including labelling of signals to be carried by respective balls 102. Each field in the schematic may represent a location of a single ball 102, and an associated signal to be input and/or output via the ball 102, in the ball grid array 100. Each ball 102 of the ball grid array 100 positioned and configured to carry a clock signal (CK) or a strobe signal (DQS) may be located in a central column 104 of the ball grid array 100. For example, the ball grid array 100 may include an odd number of columns (e.g., nine), and the central column 104 in which those balls 102 configured to carry clock signals (CK) or strobe signals (DQS) are located may have an equal number of columns on each lateral side of the central column 104.

In some embodiments, each ball 102 of the ball grid array 100 positioned and configured to carry a clock signal (CK) or a strobe signal (DQS) may be laterally and longitudinally spaced from a nearest ball 102 of the ball grid array 100 positioned and configured to carry a data signal (DQ or CA) by at least one column of the ball grid array 100. For example, at least one ball 102 of the ball grid array 100 configured to carry a reference voltage or connect to ground (VSS) may be interposed laterally between each ball 102 configured to carry a clock signal (CK) or a strobe signal (DQS) and a nearest ball 102 configured to carry a data signal (DQ or CA). More specifically, each ball 102 configured to carry a data signal (DQ or CA) may be located in a column of the ball grid array 100 spaced from the central column 104 by at least one other column.

Each ball 102 of the ball grid array 100 positioned and configured to carry a clock signal (CK) or a strobe signal (DQS) may be, for example, spaced from a perimeter of the ball grid array 100 by at least one row. More specifically, at least one other ball 102 of the ball grid array 100 configured to carry a signal (e.g., other signal symbol(s)) other than a clock signal (CK), strobe signal (DQS), or data signal (DQ or CA) may be, for example, interposed between a given ball 102 positioned and configured to carry a clock signal (CK) or a strobe signal (DQS) and a closest ball 102 at the periphery of the ball grid array 100. As a specific, nonlimiting example, at least one other ball 102 of the ball grid array 100 configured to carry a signal other than a clock signal (CK), strobe signal (DQS), or data signal (DQ or CA) may be interposed between a given ball 102 positioned and configured to carry a clock signal (CK) or a strobe signal (DQS) and a nearest ball 102 at a longitudinal end of the central column 104 of the ball grid array 100.

The ball grid array 100 shown in FIG. 1 may be at least substantially symmetrical across the central column 104. For example, about 15% of the balls 102 of the ball grid array 100 or fewer, in columns of the ball grid array 100 other than the central column 104, may be different from a corresponding ball 102 of the ball grid array 100 in a position reflected across the central column 104. More specifically, between about 5% and about 10% (e.g., about 7%, about 8%) of the balls 102 of the ball grid array 100, in columns of the ball grid array 100 other than the central column 104, may be different from a corresponding ball 102 of the ball grid array 100 in a position mirrored across the central column 104.

In some embodiments, each ball 102 of the ball grid array 100 positioned and configured to carry a data signal (DQ or CA) may be located only diagonally adjacent to any other directly adjacent balls 102 of the ball grid array 100 positioned and configured to carry a data signal (DQ or CA). For example, each ball 102 of the ball grid array 100 positioned and configured to carry a data signal (DQ or CA) may be located only diagonally adjacent to no more than three other directly adjacent balls 102 of the ball grid array 100 positioned and configured to carry another data signal (DQ or CA). More specifically, each ball 102 of the ball grid array 100 positioned and configured to carry a data signal (DQ or CA) may be located only diagonally adjacent to no more than two (e.g., zero, one, two) other directly adjacent balls 102 of the ball grid array 100 positioned and configured to carry another data signal (DQ or CA).

A perimeter of the ball grid array 100 may be, for example, at least substantially free of balls 102 positioned and configured to carry data signals (DQ or CA). Stated another way, each ball 102 of the ball grid array 100 positioned and configured to carry a data signal (DQ or CA) may be located within an interior of the perimeter of the ball grid array 100. For example, at least one other ball 102 of the ball grid array 100 configured to carry a signal other than a clock signal (CK), strobe signal (DQS), or data signal (DQ or CA) (e.g., configured to connect to a reference voltage or to ground (VSS)) may be located longitudinally outward from (e.g., closer to an exterior of the ball grid array 100 relative to) a given ball 102 positioned and configured to carry a data signal (DQ or CA). As another example, at least one other ball 102 of the ball grid array 100 configured to carry a signal other than a clock signal (CK), strobe signal (DQS), or data signal (DQ or CA) (e.g., configured to connect to a reference voltage or to ground (VSS)) may be located laterally outward from (e.g., closer to an exterior of the ball grid array 100 relative to) a given ball 102 positioned and configured to carry a data signal (DQ or CA).

Positioning those balls 102 of the ball grid array 100 configured to carry a data signal (DQ or CA) diagonally adjacent to any other directly adjacent balls 102 positioned and configured to carry a data signal (DQ or CA), and maintaining the perimeter of the ball grid array 100 at least substantially free of balls 102 positioned and configured to carry data signals (DQ or CA), may improve signal quality. For example, such positioning and layout for the balls 102 positioned and configured to carry data signals (DQ or CA) may reduce the intensity and degree of overlap among magnetic fields induced by the signals carried by the balls 102 positioned and configured to carry data signals (DQ or CA). Such a reduction in the induced magnetic fields may generate a corresponding reduction in crosstalk, producing higher signal quality and fidelity. The improvement in signal quality and fidelity may be especially pronounced when the signals carried by those balls 102 positioned and configured to carry data signals (DQ or CA) are high-frequency signals (i.e., signals operating at frequencies of between about 10 GHz and about 45 GHz, or potentially higher) and/or high-bandwidth signals (i.e., signals capable of transferring data at Baud rates of between about 15 Gigasymbols/s and about 20 Gigasymbols/s, or potentially higher).

In certain implementations, each ball 102 of the ball grid array 100 located laterally and longitudinally adjacent to each other ball 102 of the ball grid array 100 positioned configured to carry a data signal (DQ or CA) may be configured to carry a voltage (VDD, VDDQ, VDDLL), connect to ground (VSS), or connect to a calibration circuit (ZQ). For example, between about 75% and about 90% of the balls 102 surrounding a given ball 102 positioned configured to carry a data signal (DQ or CA) may themselves be positioned and configured to carry a voltage (VDD, VDDQ, VDDLL), connect to ground (VSS), or connect to a calibration circuit (ZQ). More specifically, between about 6 and about 7 of the balls 102 surrounding a given ball 102 positioned configured to carry a data signal (DQ or CA) may themselves be positioned and configured to, for example, carry a voltage (VDD, VDDQ, VDDLL), connect to ground (VSS), or connect to a calibration circuit (ZQ).

A number of the balls 102 of the ball grid array 100 shown in FIG. 1 which are positioned and configured to carry a data signal (DQ or CA) may be between about one-eighth and about one-fourth a number of the balls 102 of the ball grid array 100 which are positioned and configured to carry a voltage or connect to ground (VSS, VSSDLL, VDD, VDDQ, VDDLL, VPP). For example, the number of the balls 102 of the ball grid array 100 positioned and configured to carry a data signal (DQ or CA) may be between about 12 and about 20 (e.g., about 16). Continuing the example, the number of the balls 102 of the ball grid array 100 positioned and configured to carry a voltage or connect to ground (VSS, VSSDLL, VDD, VDDQ, VDDLL, VPP) may be between about 80 and about 90 (e.g., about 86).

In some embodiments, a number of the balls 102 of the ball grid array positioned and configured to carry a data signal (DQ or CA) may be between about one-fourth and about one-half a number of the balls 102 of the ball grid array 100 positioned and configured to connect to core system voltage (VSS) or to core system ground (VSS). For example, the number of the balls 102 of the ball grid array 100 positioned and configured to carry a data signal (DQ or CA) may be between about 12 and about 20 (e.g., about 16). Continuing the example, the number of the balls 102 of the ball grid array 100 positioned and configured to connect to core system voltage (VSS) or to core system ground (VSS) may be between about 40 and about 55 (e.g., about 45, about 52).

A number of the balls 102 of the ball grid array 100 positioned and configured to carry a data signal (DQ or CA) may be between about two-fifths and about nine-tenths a number of the balls 102 of the ball grid array 100 positioned and configured to connect to input/output memory supply voltage (VDD). For example, the number of the balls 102 of the ball grid array 100 positioned and configured to carry a data signal (DQ or CA) may be between about 12 and about 20 (e.g., about 16). Continuing the example, the number of the balls 102 of the ball grid array 100 positioned and configured to connect to input/output memory supply voltage (VDD) may be between about 15 and about 25 (e.g., about 18, about 21).

In certain implementations, a number of the balls 102 of the ball grid array 100 positioned and configured to carry a data signal (DQ or CA) may be about equal to a number of the balls 102 of the ball grid array 100 positioned and configured to connect to output driver voltage (VDDQ). For example, the number of the balls 102 of the ball grid array 100 positioned and configured to carry a data signal (DQ or CA) may be between about 12 and about 20 (e.g., about 16). Continuing the example, the number of the balls 102 of the ball grid array 100 positioned and configured to connect to output driver voltage (VDDQ) may be between about 12 and about 20 (e.g., about 16).

A number of the balls 102 of the ball grid array 100 shown in FIG. 1 which are positioned and configured to carry a data signal (DQ or CA) may be between about four times and about eight times a number of the balls 102 of the ball grid array 100 positioned and configured to connect to word line voltage (VPP). For example, the number of the balls 102 of the ball grid array 100 positioned and configured to carry a data signal (DQ or CA) may be between about 12 and about 20 (e.g., about 16). Continuing the example, the number of the balls 102 of the ball grid array 100 positioned and configured to connect to word line voltage (VPP) may be between about 2 and about 4 (e.g., about 4).

In some embodiments, a total number of balls 102 in the ball grid array 100 may be between about 100 and about 150. For example, the total number of balls 102 in the ball grid array 100 may be between about 115 and about 120 (e.g., about 117).

Figure 2:
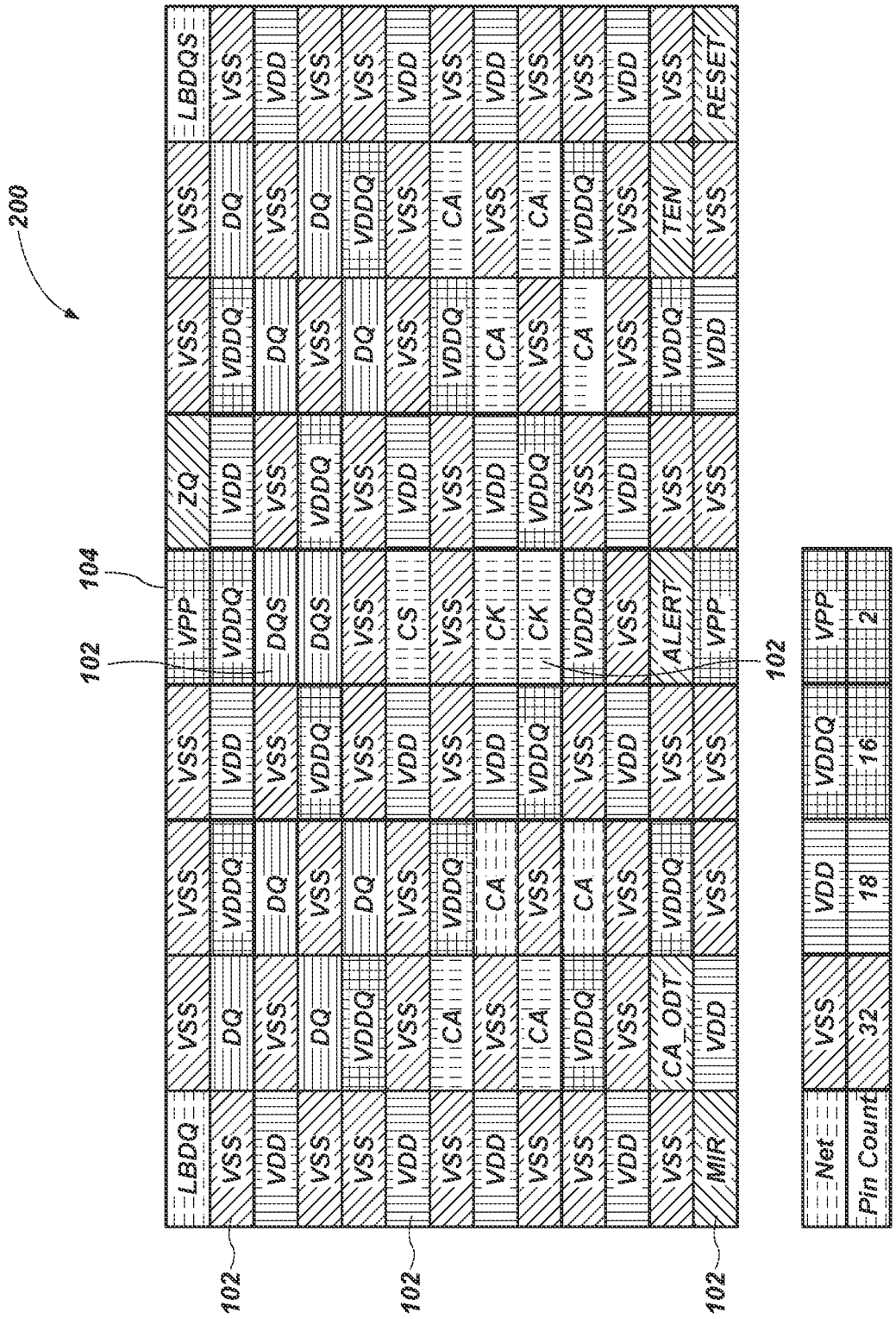
FIG. 2 is a schematic view of another embodiment of a ball grid array in accordance with this disclosure.

FIG. 2 is a schematic view of another embodiment of a ball grid array 200 in accordance with this disclosure. The ball grid array 200 of FIG. 2 may exhibit many of the same or similar features as the ball grid array 100 of FIG. 1. For example, each ball 102 of the ball grid array 100 positioned and configured to carry a clock signal (CK) or a strobe signal (DQS) may be located in a central column 104 of the ball grid array 100. Each ball 102 of the ball grid array 200 positioned and configured to carry a clock signal (CK) or a strobe signal (DQS) may also be laterally and longitudinally spaced from a nearest ball 102 of the ball grid array 100 positioned and configured to carry a data signal (DQ or CA) by at least one column of the ball grid array 200. Each ball 102 of the ball grid array 200 positioned and configured to carry a clock signal (CK) or a strobe signal (DQS) may be, for example, spaced from a perimeter of the ball grid array 200 by at least one row. The ball grid array 200 shown in FIG. 2 may be at least substantially reflectively symmetrical across the central column 104. Each ball 102 of the ball grid array 200 positioned and configured to carry a data signal (DQ or CA) may be located only diagonally adjacent to any other directly adjacent balls 102 of the ball grid array 100 positioned and configured to carry a data signal (DQ or CA). A perimeter of the ball grid array 200 may be, for example, at least substantially free of balls 102 positioned and configured to carry data signals (DQ or CA). Each ball 102 of the ball grid array 200 located laterally and longitudinally adjacent to each other ball 102 of the ball grid array 200 positioned configured to carry a data signal (DQ or CA) may be configured to carry a voltage or connect to ground (VDD, VDDQ, VSS).

One notable difference between the ball grid array 100 of FIG. 1 and the ball grid array 200 of FIG. 2 is that a ball 102 configured to carry a control signal (CS) shown in FIG. 2 may be located in the same, central column 104 as the balls 102 respectively configured to carry clock signals (CK) or strobe signals (DQS), rather than an adjacent column, as shown in FIG. 1. Such a configuration may further increase the reflective symmetry of the ball grid array 200 across the central column 104. To reduce cross-talk, the ball 102 configured to carry the control signal (CS) may not be located longitudinally or laterally adjacent any ball 102 configured to carry a clock signal (CK) or a strobe signal (DQS), as is the case in both FIG. 1 and FIG. 2. More specifically, at least one ball 102 (e.g., at least one row) of the ball grid array 200 may be, for example, interposed between the ball 102 configured to carry the control signal (CS) and each nearest ball 102 configured to carry a clock signal (CK) or a strobe signal (DQS), as shown in FIG. 2.

Another notable difference between the ball grid array 100 of FIG. 1 and the ball grid array 200 of FIG. 2 is that a ball 102 configured to connect to a calibration circuit (ZQ) may be located in a different portion of the perimeter of the ball grid array 200. For example, the ball 102 configured to connect to the calibration circuit (ZQ) shown in FIG. 2 may be located in a top row (Row A) of the ball grid array 200 when oriented as shown in FIG. 2, whereas the ball 102 configured to connect to the calibration circuit (ZQ) shown in FIG. 1 may be located in a rightmost column (Column 9) of the ball grid array 100 when oriented as shown in FIG. 1.

While other differences between the ball grid array 100 of FIG. 1 and the ball grid array 200 of FIG. 2 will be apparent to those skilled in the art, another difference of note is that the numbers of balls 102 configured to carry a voltage or connect to ground (VSS, VDD, VPP), as well as the presence of balls 102 configured to carry certain specific reference voltages (VSSDLL), may differ between FIG. 1 and FIG. 2. For example, the number of balls 102 configured to connect to core system voltage (VSS) or to core system ground (VSS) may be greater in FIG. 2 than in FIG. 1 by about seven balls 102. The number of balls 102 configured to connect to input/output memory supply voltage (VDD) may be less in FIG. 2 than in FIG. 1 by about three balls 102. The number of balls 102 configured to connect to word line voltage (VPP) may be less in FIG. 2 than in FIG. 1 by about two balls 102. Finally, the number of balls 102 configured to connect to certain specific reference voltages (VSSDLL) may be less in FIG. 2 than in FIG. 1 by about two balls 102.

In some embodiments, the specific layout of clock signals (CK) and/or strobe signals (DQS) in the central column 104 of a given ball grid array may differ from the layout shown in FIGS. 1 and 2. For example, one or more of the balls 102 positioned and configured to carry clock signals (CK) may be configured as carrying, or one or more of the balls 102 positioned and configured to carry strobe signals (DQS) may be modified to carry, write clock (WCK) signals or read clock (RCK) signals. More specifically, the pair of balls 102 shown in FIGS. 1 and 2 as positioned and configured to carry strobe signals (DQS) may be, for example, replaced with balls 102 positioned and configured to carry write clock (WCK) and read clock (RCK) signals, respectively.

Figure 3:
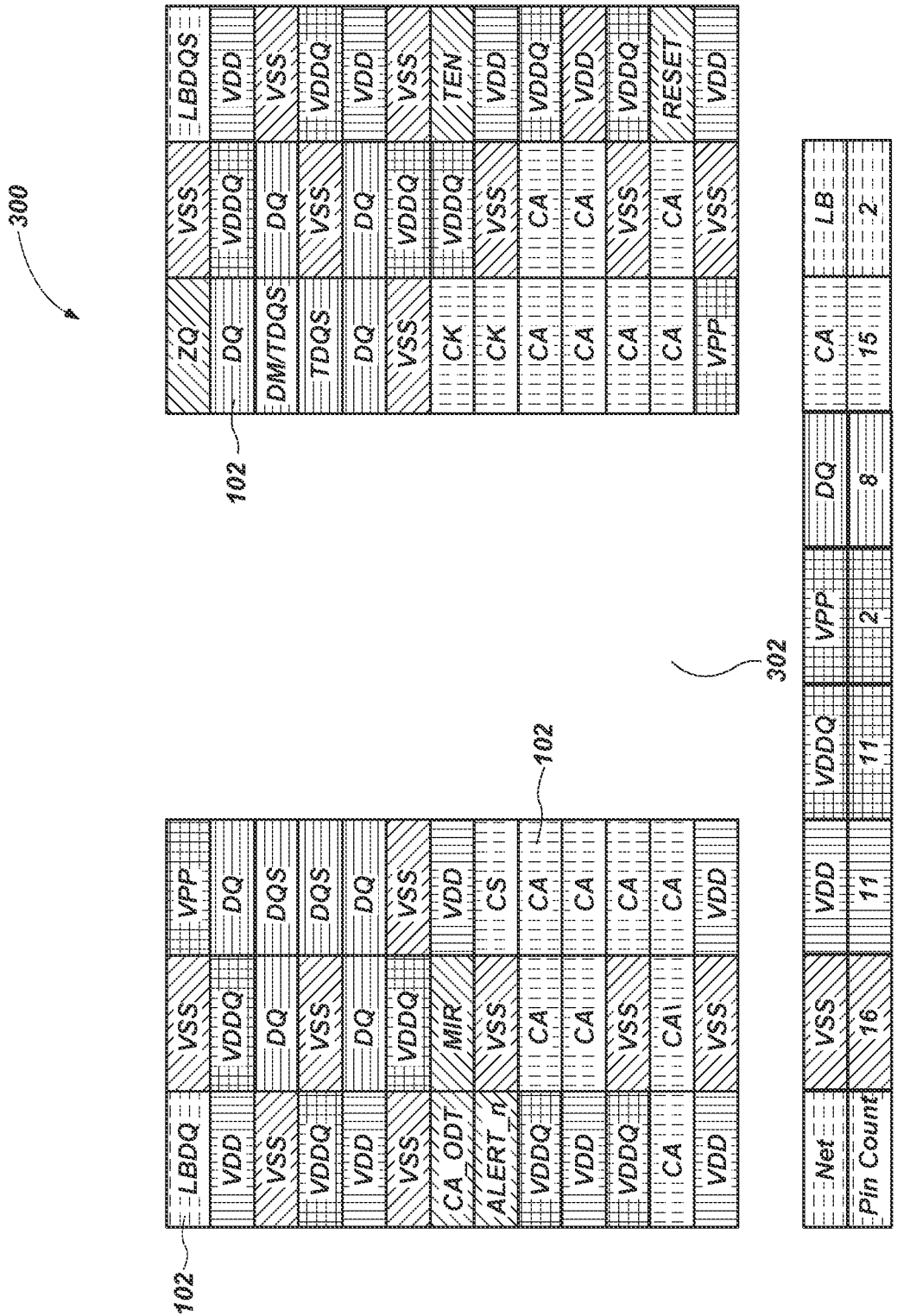
FIG. 3 is a schematic view of a state-of-the-art ball grid array known to the inventors.

FIG. 3 is a schematic view of a state-of-the-art ball grid array 300 known to the inventors. As shown in FIG. 3, the ball grid array 300 may be less symmetrical than the ball grid array 100 of FIG. 1 and the ball grid array 200 of FIG. 2. For example, the ball grid array 300 of FIG. 3 may lack any central column 104 about which to form reflective symmetry. Because clock signals (CK) and strobe signals (DQS) tend to be differential signals, positioning the balls 102 configured to carry those signals on opposite sides of the central gap 302 may be impracticable. In addition, the ball grid array 300 may have fewer available columns, and fewer balls 102 with which to associate a given signal, resulting in closer packing of high-importance signals, such as the data signals (DQ and CA). Finally, the ball grid array 300 may have more balls 102 dedicated to carry data signals (DQ or CA), resulting in close packing.

The increased symmetry, and spacing of high-importance signals from one another, provided by the ball grid array 100 of FIG. 1 and the ball grid array 200 of FIG. 2 may reduce cross-talk among the balls 102 when compared to the ball grid array 300 of FIG. 3, improving signal quality. In addition, the greater symmetry provided by the ball grid array 100 of FIG. 1 and the ball grid array 200 of FIG. 2 may enable, and encourage, use of signal routing techniques in higher-level packaging that may better preserve, and even increase, the already higher-quality signals. Such increases in signal quality may enable transfer of data at higher clock speeds, and higher bandwidths, than those achievable utilizing the ball grid array 300 of FIG. 3.

Figure 4:
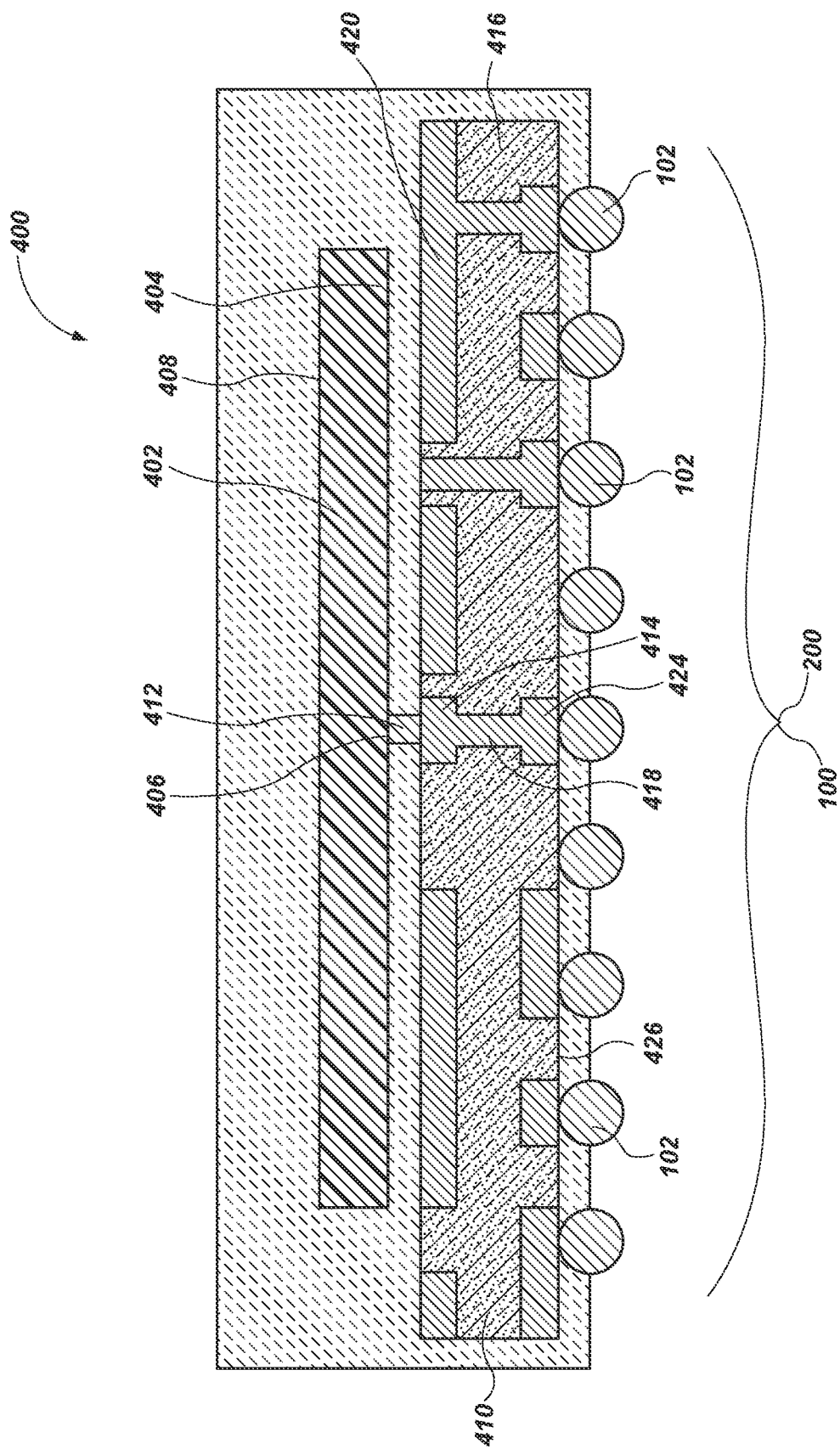
FIG. 4 is a schematic, cross-sectional side view of a semiconductor device package including a ball grid array in accordance with this disclosure.

FIG. 4 is a schematic, cross-sectional side view of a semiconductor device package 400 including the ball grid array 100 of FIG. 1 or the ball grid array 200 of FIG. 2. The semiconductor device package 400 may include a device substrate 402 including a semiconductor material capable of forming and/or supporting integrated circuitry. More specifically, the device substrate 402 may include an active surface 404 having integrated circuitry embedded therein and/or supported thereon, bond pads 406 (which may also be characterized as "die pads") on and coupled with the active surface 404 operatively connected to the integrated circuitry and configured to provide input and output connections for the integrated circuitry, and an inactive surface 408 located on a side of the device substrate 402 opposite the active surface 404. As a specific, nonlimiting example, the device substrate 402 may include an active surface 404 having integrated circuitry configured as memory (e.g., Double Data Rate (GDDR) type 5 or higher Synchronous Dynamic Random-Access Memory (SDRAM)), bond pads 406 forming a row located at least substantially centrally on, and distal from a lateral periphery of, the active surface 404, and an inactive surface 408 lacking any integrated circuitry located on a side of the device substrate 402 opposite the active surface 404. The device substrate 402 may be an electrically passive substrate in at least some embodiments, notwithstanding the characterization of the active surface 404 bearing integrated circuitry as an "active" surface.

The package substrate 410 may generally be configured to route signals to and from the device substrate 402 and to provide more convenient connection configurations when compared to dimensions of the bond pads 406 of the device substrate 402 itself. For example, the package substrate 410 may be configured as a printed circuit board (PCB), an interposer, or other structure for routing electrical signals to and from the bond pads 406 of the device substrate 402. More specifically, the package substrate 410 may include selectively positioned regions of electrically conductive material and dielectric material, and the electrically conductive material may be operatively connected, and mechanically secured, to the bond pads 406 of the device substrate 402 by conductive elements 412 (e.g., copper pillars) interposed between the package substrate 410 and the device substrate 402. As a specific, nonlimiting example, the package substrate 410 may include input lands 414 of electrically conductive material in contact with the conductive elements 412 (which are, in turn, in contact with the bond pads 406), layers 416 of the dielectric material, vias 418 of electrically conductive material positioned and configured to carry signals from the device substrate 402 received at the input lands 414 longitudinally (i.e., in a direction at least substantially perpendicular to the active surface 404 of the device substrate 402) at least partially through a thickness of the package substrate 410, traces 420 of electrically conductive material positioned and configured to carry signals from the device substrate 402 received at the input lands 414 laterally (i.e., in a direction at least substantially parallel to the active surface 404 of the device substrate 402) along surfaces of the layers 416 of the dielectric material, and output lands 424 of electrically conductive material located on a side of the package substrate 410 opposite the device substrate 402, the output lands 424 being configured to output signals routed from the input lands 414, through the traces 420 and vias 418 to the output lands 424. Suitable conductive materials for the traces 420, conductive elements 412, and any other electrically conductive structures of the package substrate 410 may include, for example, aluminum, gold, copper, and alloys and combinations thereof. Suitable dielectric materials for the remainder of the package substrate 410, such as the layers 416, may include, for example, dielectric polymer resins.

A ball grid array 100 or 200 (or other electrical interconnect comprising discrete conductive elements) may be supported on, and electrically connected to a side of the package substrate 410 opposite the device substrate 402. For example, the ball grid array 100 or 200 may include balls 102 of electrically conductive material supported on, and secured to, the output lands 424 of the package substrate 410, and the balls 102 may be distributed in an array forming a repeating, geometric pattern. More specifically, the balls 102 of the ball grid array 100 or 200 may be positioned to form a grid of rectangles (e.g., squares) formed by lines interconnecting geometric centers of adjacent balls 102, with the geometric centers of the adjacent balls 102 at least substantially forming the vertices of the rectangles. As a specific, nonlimiting example, the balls 102 of the ball grid array 100 or 200 may be distributed across an entire major surface 426 of the package substrate 410 as may result from a direct-chip-attach configuration, with no discontinuities in the ball grid array 100 or 200 that would form open areas or gaps underlying the bond pads 406 of the device substrate 402. The material of the balls 102 may include, for example, solder (e.g., tin/silver solder). In some packages, the ball grid array 100 or 200 may be located on the underside of the package substrate 410 and may bridge a space between the package substrate 410 and a connected device or structure (e.g., a PCB, a chip, another package substrate), as shown and discussed in greater detail in connection with FIG. 6.

A ball grid array 100 or 200 in accordance with this disclosure, including the density of balls 102 and shape for the ball grid array 100 or 200, may be facilitated by a direct chip attach for connecting the device substrate 402 to the package substrate 410. In such a configuration, an active surface 404 of at least a closest device substrate 402 may face and be located proximate to the input lands 414 on the package substrate 410. In addition, the connection between the closest device substrate 402 and the package substrate 410 may be made by conductive elements 412 other than wire bonds, such as balls, bumps, pillars, posts, columns, studs, or other shapes facilitating closer proximity and reduced conductive path lengths in comparison to wire bonds. In the embodiment of FIG. 4, the semiconductor device package 400 includes a single device substrate 402 direct chip attached to the package substrate 410, which may also be referred to as a single die package (SDP) configuration. Additional direct chip attach configurations are described in greater detail in connection with FIG. 8 and FIG. 9. While the device substrate 402 shown in FIG. 5 may particularly be configured as a DRAM device (e.g., SDRAM), ball grid arrays 100 or 200 in accordance with this disclosure may be beneficially deployed with other types of memory devices or non-memory devices.

In summary, semiconductor device packages in accordance with this disclosure may include, for example, a device substrate including a semiconductor material and bond pads coupled with an active surface of the device substrate facing the package substrate. A package substrate may be secured to the device substrate, the package substrate configured to route signals to and from the bond pads. A ball grid array may be supported on, and electrically connected to, the package substrate. Each ball of the ball grid array positioned and configured to carry a clock signal or a strobe signal may be located in a central column of the ball grid array.

Figure 5:
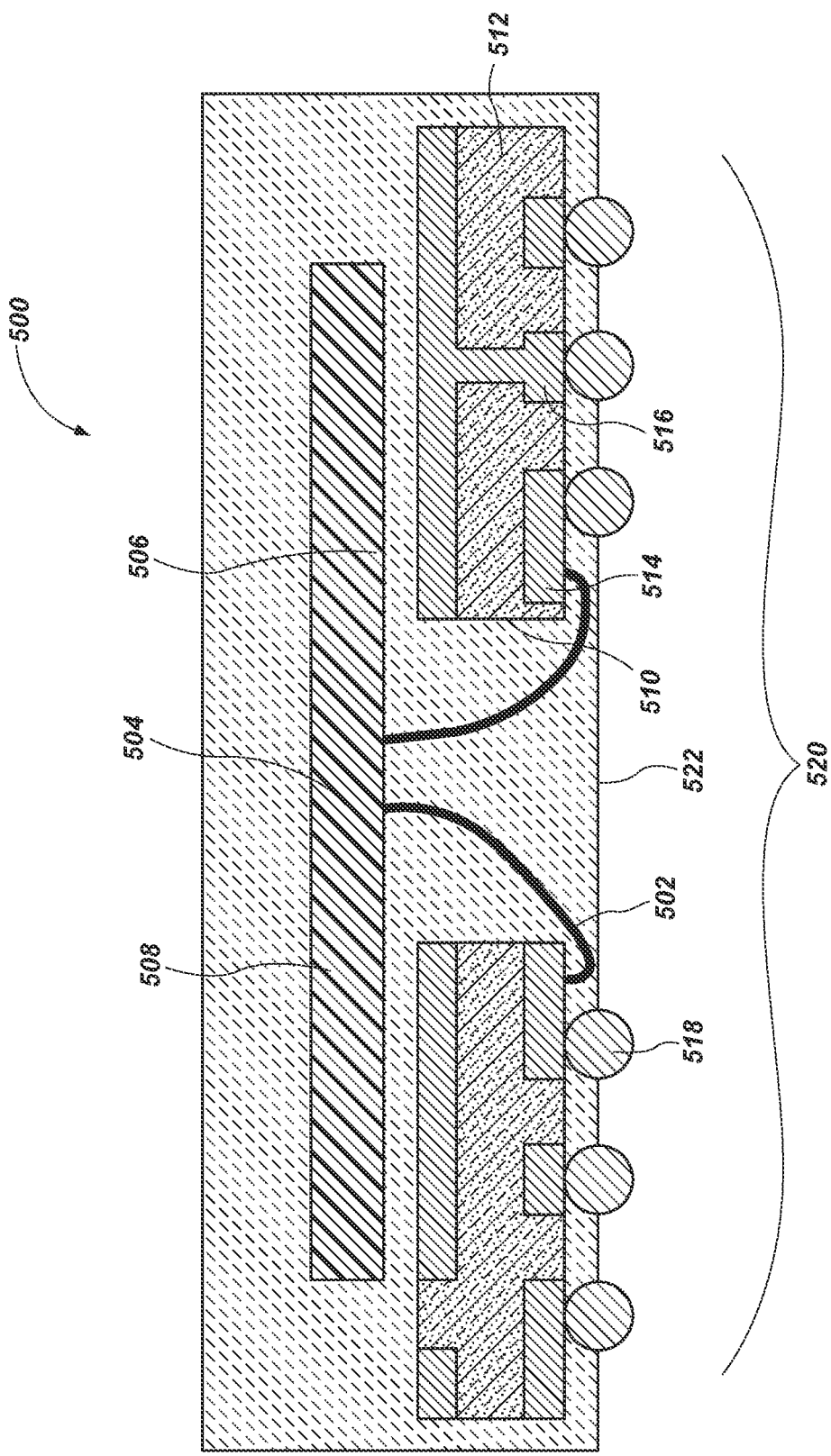
FIG. 5 is a schematic, cross-sectional side view of a state-of-the-art semiconductor device package known to the inventors.

FIG. 5 is a schematic, cross-sectional side view of a state-of-the-art semiconductor device package 500 known to the inventors. Specifically shown in FIG. 5 is a configuration where wire bonds 502 extend from bond pads 504 on the active surface 506 of the device substrate 508, through a window 510 in the package substrate 512, to input lands 514 located on a side of the package substrate 512 opposite the device substrate 508. In such a configuration, the output lands 516 may be located on the same side of the package substrate 512 as the input lands 514, all of which may be located on a side of the package substrate 512 opposite the device substrate 508. Configurations like that of FIG. 5 may alternatively be termed "board-on-chip" connections between a device substrate 508 and a package substrate 512.

When using a board-on-chip connection, the ball grid array 520 may include a gap 522 underlying the bond pads 504 of the device substrate 508 in which no balls 518 of the ball grid array 520 may be located. Because there is such a gap 522, balls 518 for differential signals, such as, for example, clock signals and strobe signals (e.g., the clock signals (CK) and strobe signals (DQS) of FIGS. 1 and 2), may produce asymmetries relative to ball 518 located in the same position across the gap 522. As a result, the ball grid array 520 of FIG. 5 may be asymmetrical in ways that the ball grid arrays 100 and 200 of FIGS. 1 and 2 are not. These asymmetries may directly degrade signal quality and increase the likelihood that downstream signal routing techniques may further degrade signal quality. Accordingly, the ball grid arrays 100 and 200 of FIGS. 1 and 2 may produce higher signal quality, particularly for high-speed, high-bandwidth, or high-speed and high-bandwidth data signals. In addition, ball grid arrays in accordance with this disclosure, such as the ball grid arrays 100 and 200 of FIGS. 1 and 2, may reduce the routing complexity introduced when accommodating non-centered balls 518 configured to carry clock signals (CK) and/or strobe signals (DQS) (see FIGS. 1 and 2) in a board-on-chip connection, such as that shown in FIG. 5, when compared to the complexity of routing to accommodate corresponding centered balls 102 (see FIGS. 1, 2).

Figure 6:
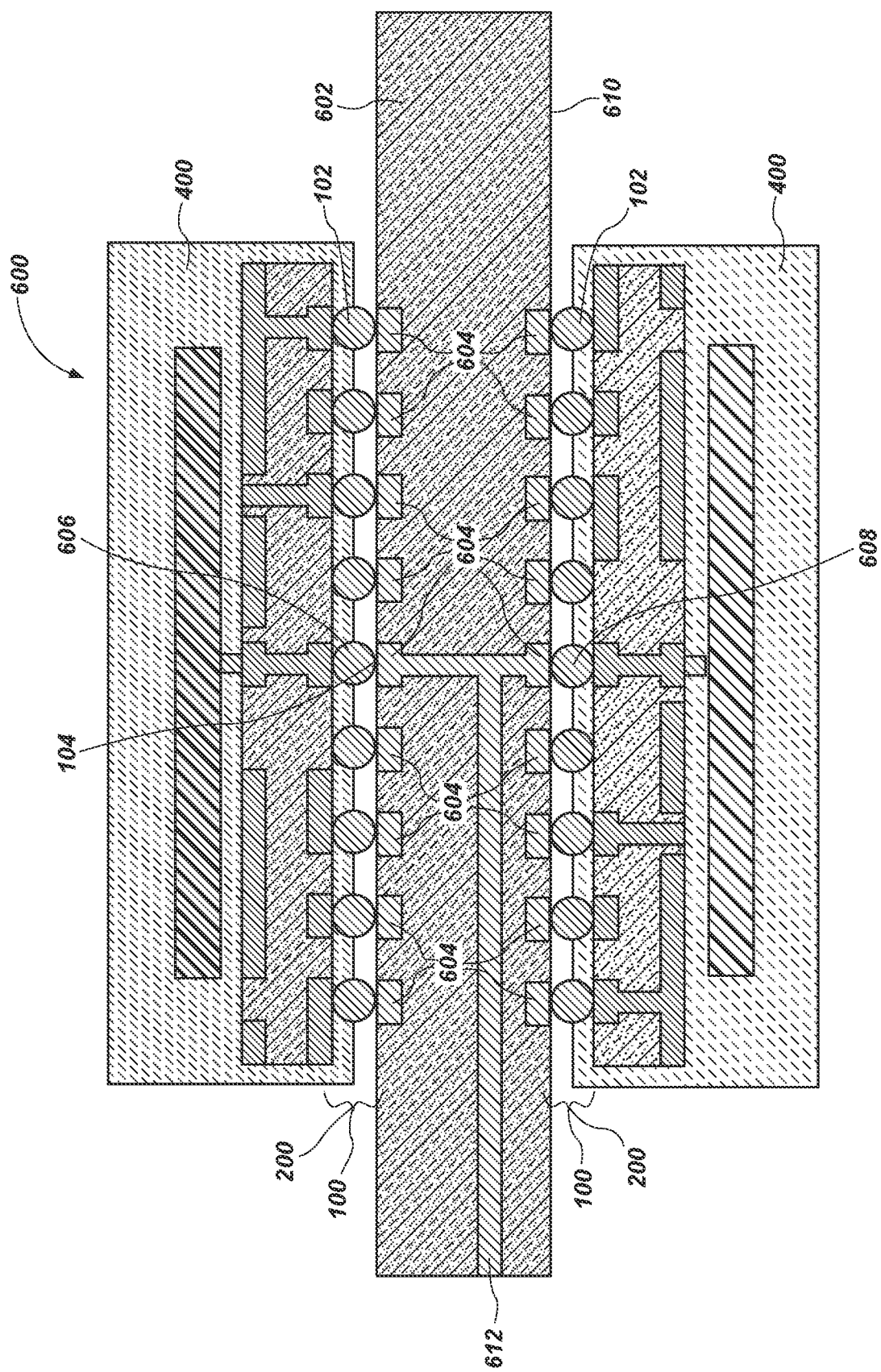
FIG. 6 is a schematic, cross-sectional side view of an assembly of semiconductor device packages including ball grid arrays in accordance with this disclosure.

FIG. 6 is a schematic, cross-sectional side view of an assembly 600 including multiple semiconductor device packages 400 including the ball grid array 100 of FIG. 1 or the ball grid array 200 of FIG. 2. The semiconductor device packages 400 may be mutually connected to a shared printed circuit board 602 utilizing the ball grid arrays 100 or 200 of the semiconductor device packages 400. More specifically, the printed circuit board 602 may be interposed between, and secured to, each of a first semiconductor device package 400 and a second semiconductor device package 400. As a specific, nonlimiting example, the first semiconductor device package 400 may be located on, and secured to, a first side of the printed circuit board 602 utilizing its ball grid array 100 or 200, the second semiconductor device package 400 may be located on, and secured to, a second, opposite side of the printed circuit board 602 utilizing its ball grid array 100 or 200, and the ball grid array 100 or 200 of the second semiconductor device package 400 may be rotationally symmetrical with the ball grid array 100 or 200 of the first semiconductor device package 400 about an axis located centrally within the printed circuit board 602, the axis extending parallel to the central columns 104 of the ball grid arrays 100 or 200. Such a configuration may alternatively be referred to as a "clamshell" connection of the semiconductor device packages 400 to the printed circuit board 602.

The printed circuit board 602 may include electrical conductors 604 (e.g., pads, vias, traces) located within the printed circuit board 602, the electrical conductors 604 being electrically connected to the balls 102 of the ball grid arrays 100 or 200 of the semiconductor device packages 400. A first ball 606 of the ball grid array 100 or 200 of the first semiconductor device package 400 may be positioned and configured to carry a clock signal or a strobe signal, and a second ball 608 of the ball grid array 100 or 200 of the second semiconductor device package 400 may likewise be positioned and configured to carry a clock signal or a strobe signal. The electrical conductor 604 connected to the first ball 606 and the second ball 608 may extend at least substantially perpendicular to a major surface 610 of the printed circuit board 602 over at least substantially an entire distance between the first ball 606 and the second ball 608. This kind of direct, vertical interconnection between the first ball 606 and the second ball 608 may preserve and increase signal quality. A trace 612 may optionally extend laterally outward from the vertically extending electrical conductor 604.

While the assembly 600 shown in FIG. 6 may particularly be shown as semiconductor device packages 400 configured as memory devices connected to a printed circuit board 602 configured as a dual in-line memory module (DIMM), ball grid arrays 100 or 200 in accordance with this disclosure may be beneficially deployed with other types of memory devices, non-memory devices, other types of printed circuit boards, or substrates other than printed circuit boards.

In summary, an apparatus in accordance with this disclosure may include a first memory device and a second memory device. The first memory device may include a device substrate including a semiconductor material and bond pads coupled with an active surface of the device substrate. A package substrate may be secured to the device substrate, the package substrate configured to route signals to and from the bond pads. A ball grid array may be supported on, and electrically connected to, the package substrate. A printed circuit board may be interposed between, and secured to, each of the first memory device and the second memory device. Each ball of the ball grid array of the first memory device positioned and configured to carry a clock signal or a strobe signal may be located in a central column of the ball grid array.

In other embodiments, apparatuses may include a first memory device, including a device substrate comprising a semiconductor material and bond pads coupled with an active surface of the device substrate. A package substrate may be secured to the device substrate, the device substrate secured to the package substrate by a direct chip attach. The package substrate may be configured to route signals to and from the bond pads. A first ball grid array may be supported on, and electrically connected to, the package substrate. A second memory device may include a second ball grid array. A printed circuit board may be interposed between, and secured to, each of the first ball grid array of the first memory device and the second ball grid array of the second memory device, the second ball grid array of the second memory device being rotationally symmetrical across the printed circuit board relative to the first ball grid array of the first memory device. Each ball of the ball grid array of the first memory device positioned and configured to carry a clock signal or a strobe signal is located in a central column of the ball grid array.

Figure 7:
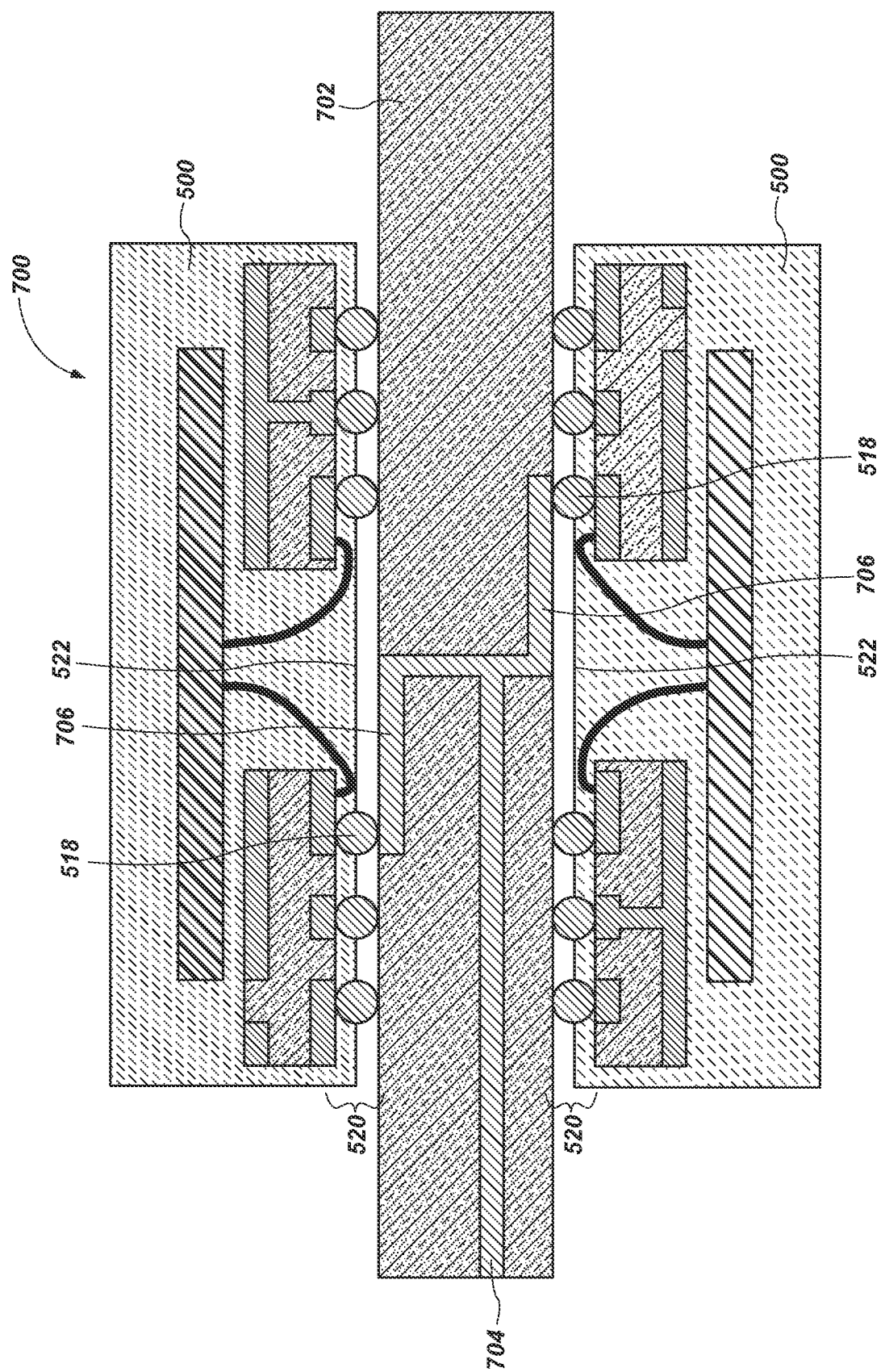
FIG. 7 is a schematic, cross-sectional side view of a state-of-the-art assembly of semiconductor device packages known to the inventors.

FIG. 7 is a schematic, cross-sectional side view of a state-of-the-art assembly 700 of semiconductor device packages 500 known to the inventors. To interconnect the asymmetrical balls 518 of the ball grid arrays 520, the electrical conductor 704 extending between corresponding balls 518, such as those configured to carry clock signals or strobe signals, may include asymmetrical, laterally extending traces 706. At least portions of the traces 706 may be aligned with, and extend laterally across, the gaps 522 in the ball grid arrays 520, forming a portion of the distance between the interconnected balls 518.

This asymmetry in the ball grid arrays 520 and the downstream routing of the electrical conductor 704 in the printed circuit board 702 may produce asymmetries in the electrical fields produced by signals carried by the balls 518 and the electrical conductor 704. These asymmetries in the electrical fields may produce different levels of cross-talk among electrical conductors, degrading signal quality. The improvements present in the ball grid arrays 100 and 200 of FIG. 1 and FIG. 2 may improve signal quality, particularly at high speeds, high bandwidths, or high speeds and high bandwidths. In addition, ball grid arrays in accordance with this disclosure, such as the ball grid arrays 100 and 200 of FIGS. 1 and 2, may reduce (e.g., eliminate) reliance on traces 706 and trace segments for routing signals when compared to state-of-the-art approaches, such as that depicted in FIG. 7. The reduction in reliance on traces 706 and trace segments enabled by ball grid arrays in accordance with this disclosure may free up space for other signal routes and/or for shapes for traces 706 enabling more reliable power delivery.

Figure 8:
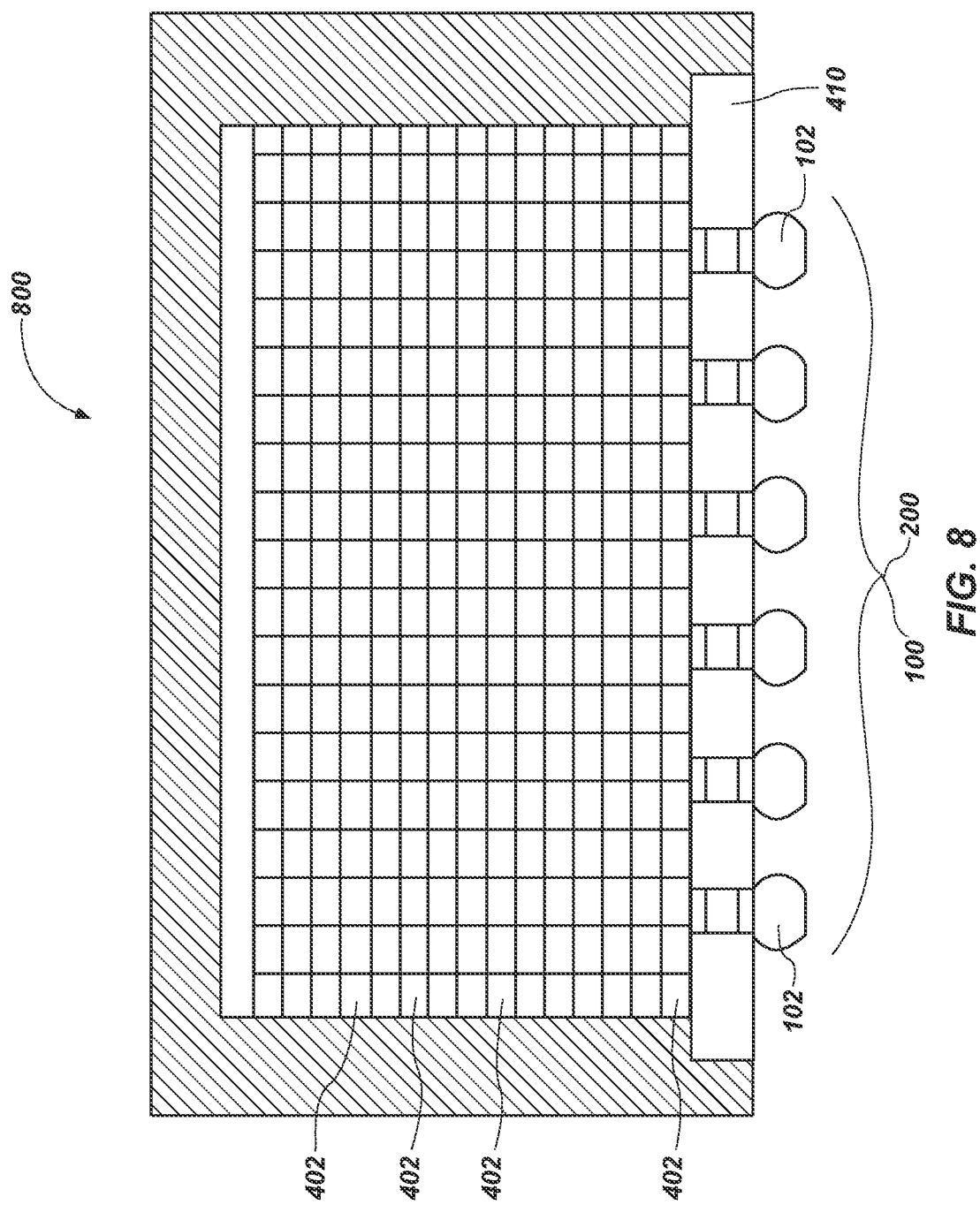
FIG. 8 is a schematic, cross-sectional side view of another embodiment of a semiconductor device package including a ball grid array in accordance with this disclosure.

FIG. 8 is a schematic, cross-sectional side view of another embodiment of a semiconductor device package 800 including a ball grid array 100 or 200 in accordance with this disclosure. More specifically, FIG. 8 depicts another embodiment of a direct chip attach connection between a device substrate 402 and a package substrate 410. For example, the semiconductor device package 800 may include a stack of device substrates 402 interconnected to one another and supported on the package substrate 410. The device substrates 402 may be interconnected to one another by mutually aligned conductive vias 418 (e.g., through silicon vias (TSVs)) extending longitudinally through the device substrates 402. Such a configuration may also be characterized as a "three-dimensional stack" (3DS), and may enable the device substrates 402 to be stacked in such a manner that lateral sides of the device substrate 402 are at least substantially aligned with one another (e.g., at least substantially flush with one another). The semiconductor device package 800 may be connected to a printed circuit board 602 in a manner similar to, or the same as, that described in connection with FIG. 6.

Figure 9:
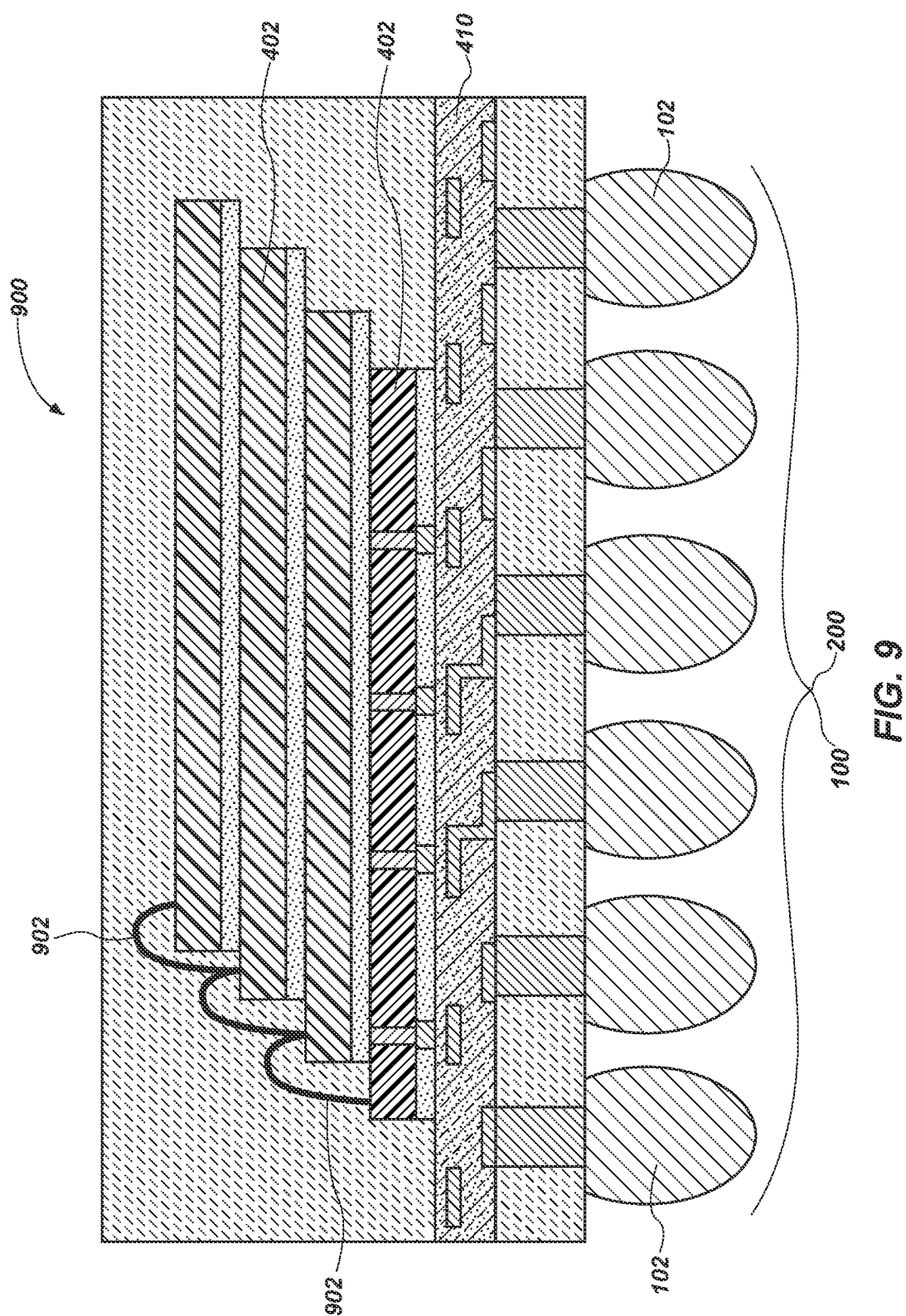
FIG. 9 is a schematic, cross-sectional side view of another embodiment of a semiconductor device package including a ball grid array in accordance with this disclosure.

FIG. 9 is a schematic, cross-sectional side view of another embodiment of a semiconductor device package 900 including a ball grid array 100 or 200 in accordance with this disclosure. More specifically, FIG. 9 depicts another embodiment of a direct chip attach connection between a device substrate 402 and a package substrate 410. As a specific, nonlimiting example, FIG. 9 may depict a bottommost device substrate 402 attached to a package substrate 410 in a flip-chip, direct chip attach configuration, with overlying device substrate 402 interconnected to one another and to the bottommost device substrate 402 by wire bonds 902. For example, the semiconductor device package 900 may include a stack of device substrates 402 interconnected to one another and supported on the package substrate 410. The device substrates 402 may be interconnected to one another by wire bonds 902 located proximate to lateral peripheries of the device substrates 402. Such a configuration may also be characterized as a "hybrid three-dimensional stack" (hybrid 3DS), and may enable the device substrates 402 to be stacked in such a manner that lateral sides of the device substrate 402 are laterally offset from one another in a so-called "shingle stack" (e.g., forming a stair-step shape). The semiconductor device package 900 may be connected to a printed circuit board 602 in a manner similar to, or the same as, that described in connection with FIG. 6.

Figure 10:
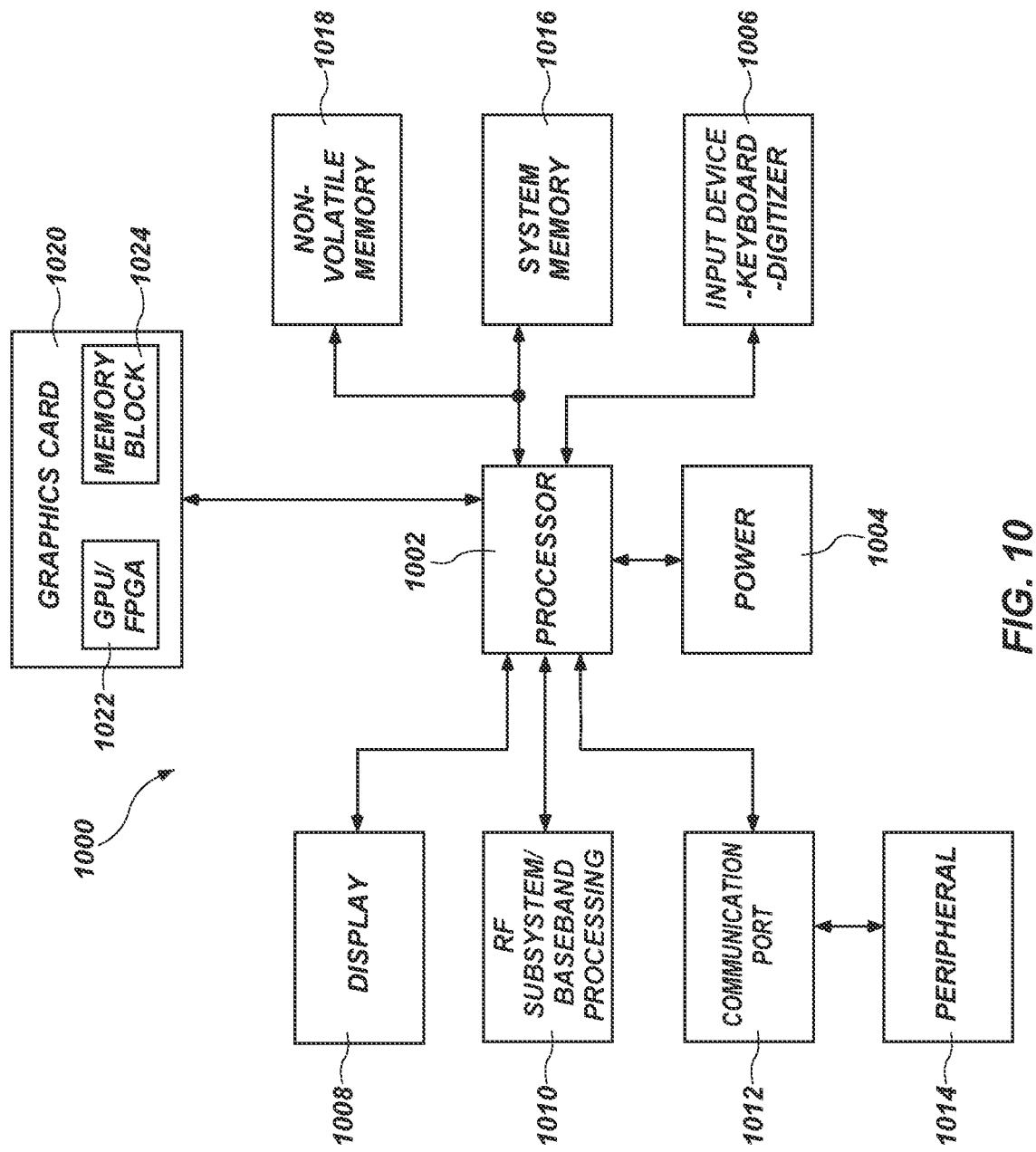
FIG. 10 is a block diagram of an electronic system incorporating memory configured as BGA packages in accordance with embodiments of the disclosure.

FIG. 10 is a block diagram of an electronic system 1000 incorporating memory 1016, 1018, 1024 configured as BGA packages in accordance with embodiments of the disclosure. The electronic system 1000 may include various semiconductor devices manufactured in accordance with embodiments of the present disclosure. For example, the electronic system 1000 may be any of a variety of types, such as a computer, tablet, cellular phone, smartphone, control circuit, or other electronic device. The electronic system 1000 may include one or more processors 1002, such as a microprocessor, to control the processing of system functions and requests in the electronic system 1000.

The electronic system 1000 may include a power supply 1004 in operable communication with the processor 1002. For example, if the electronic system 1000 is a portable system, the power supply 1004 may include one or more of a fuel cell, a power scavenging device, permanent batteries, replaceable batteries, and/or rechargeable batteries. The power supply 1004 may also include an AC adapter; therefore, the electronic system 1000 may be plugged into a wall outlet, for example. The power supply 1004 may also include a DC adapter such that the electronic system 1000 may be plugged into a vehicle cigarette lighter or a vehicle power port, for example.

Various other devices may be coupled to the processor 1002 depending on the functions that the electronic system 1000 performs. For example, a user interface 1006 may be coupled to the processor 1002. The user interface 1006 may include input devices such as buttons, switches, a keyboard, a light pen, a mouse, a digitizer and stylus, a touch screen, a voice recognition system, a microphone, or a combination thereof. A display 1008 may also be coupled to the processor 1002. The display 1008 may include an LCD display, an SED display, a CRT display, a DLP display, a plasma display, an OLED display, a LED display, a three-dimensional projection, an audio display, or a combination thereof. Furthermore, an RF sub-system/baseband processor 1010 may also be coupled to the processor 1002. The RF sub-system/baseband processor 1010 may include an antenna that is coupled to an RF receiver and to an RF transmitter (not shown). A communication port 1012, or more than one communication port 1012, may also be coupled to the processor 1002. The communication port 1012 may be adapted to be coupled to one or more peripheral devices 1014, such as a modem, a printer, a computer, a scanner, or a camera, or to a network, such as a local area network, remote area network, intranet, or the Internet, for example.

The processor 1002 may control the electronic system 1000 by implementing software programs stored in the memory 1016, 1018. The software programs may include an operating system, database software, drafting software, word processing software, media editing software, or media playing software, for example. The memory 1016, 1018 is operably coupled to the processor 1002 to store and facilitate execution of various programs. For example, the processor 1002 may be coupled to system memory 1016, which may include one or more of spin torque transfer magnetic random access memory (STT-MRAM), magnetic random access memory (MRAM), dynamic random access memory (DRAM) (e.g., synchronous DRAM (SDRAM) conforming with a double data rate (DDR) and/or graphics DDR (GDDR) standard (DDR4, DDR5, DDR6)), static random access memory (SRAM), racetrack memory, and other known memory types. The system memory 1016 may include volatile memory, non-volatile memory, or a combination thereof. The system memory 1016 is typically large so that it can store dynamically loaded applications and data. In some embodiments, the system memory 1016 may include one or more ball grid arrays (or other arrayed electrical interconnects) and associated signal configurations in accordance with this disclosure, such as the ball grid arrays and associated signal configurations described above.

The processor 1002 may also be coupled to non-volatile memory 1018, which is not to suggest that system memory 1016 is necessarily volatile. The non-volatile memory 1018 may include one or more of STT-MRAM, MRAM, read-only memory (ROM) such as an EPROM, resistive read-only memory (RROM), and flash memory to be used in conjunction with the system memory 1016. The size of the non-volatile memory 1018 is typically selected to be just large enough to store any necessary operating system, application programs, and fixed data. Additionally, the non-volatile memory 1018 may include a high-capacity memory such as disk drive memory, such as a hybrid-drive including resistive memory or other types of non-volatile solid-state memory, for example. In some embodiments, the non-volatile memory 1018 may include one or more ball grid arrays (or other arrayed electrical interconnects) and associated signal routing configurations in accordance with this disclosure, such as the ball grid arrays and associated signal routing configurations described above.

In some embodiments, the electronic system 1000 may include a graphics subsystem, such as a graphics card 1020, connected to the processor 1002. For example, each of the graphics card 1020 and the processor 1002 may be connected to, and supported on, a motherboard in their respective sockets (e.g., a peripheral component interconnect express (PCIe) socket for the graphics card 1020, a CPU socket for the processor 1002). The graphics card 1020 may include its own processing device, such as a graphics processing unit (GPU) or field-programmable gate array (FPGA) 1022. The GPU or FPGA 1022 may be configured to, and may be a dedicated device for, processing graphics-related tasks to accelerate the creation of images in a frame buffer intended for output to the display 1008. The graphics card 1020 may also include a memory bank, such as, for example, a graphics memory block 1024, which may include one or more high-speed memory devices connected to the GPU or FPGA 1022 and configured to store and facilitate acceleration of graphics-related data. More specifically, the graphics memory block 1024 may include one or more banks of devices configured as dynamic random access memory (DRAM) (e.g., synchronous DRAM (SDRAM) conforming with a double data rate (DDR) and/or graphics DDR (GDDR) standard (GDDR5, GDDR6, GDDR7)). In some embodiments, one or more of the graphics subsystem, graphics card 1020, GPU or FPGA 1022, and/or graphics memory block 1024 may include one or more ball grid arrays (or other arrayed electrical interconnects) and associated signal routing configurations in accordance with this disclosure, such as the ball grid arrays and associated signal routing configurations described above. For example, one or more balls of the graphics memory block 1024 may be configured to communicate data, command/address information, or both, from the GPU or FPGA 1022 with the processor 1002.

In summary, a system in accordance with this disclosure may include a central processing unit (CPU) and at least one memory device connected to the CPU. The memory device or memory devices may include a device substrate including a semiconductor material and bond pads coupled with an active surface of the device substrate. A package substrate may be secured to the device substrate, the package substrate configured to route signals to and from the bond pads. A ball grid array may be supported on, and electrically connected to, the package substrate. Each ball of the ball grid array positioned and configured to carry a clock signal or a strobe signal may be located in a central column of the ball grid array.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure.

What is claimed is:

1. An apparatus, comprising:
    a device substrate comprising a semiconductor material and bond pads coupled with an active surface of the device substrate;
    a package substrate secured to the device substrate, the package substrate configured to route signals to and from the bond pads; and
    a ball grid array supported on, and electrically connected to, the package substrate, the ball grid array comprising an odd number of columns, such that the ball grid array comprises a central column having equal numbers of other columns on opposite sides of the central column;

wherein each ball of the ball grid array positioned and configured to carry a clock signal or a strobe signal is located in the central column of the ball grid, array,
wherein a total number of balls in the ball grid array is between about 115 and about 120.

2. The apparatus of claim 1, wherein each ball of the ball grid array positioned and configured to carry a clock signal or a strobe signal is laterally and longitudinally spaced from a nearest ball of the ball grid array positioned and configured to carry a data signal by at least one column of the ball grid array.

3. The apparatus of claim 1, wherein each ball of the ball grid array positioned and configured to carry a clock signal or a strobe signal is spaced from a perimeter of the ball grid array by at least one row.

4. The apparatus of claim 1, wherein the device substrate is secured to the package substrate by a direct chip attach.

5. The apparatus of claim 1, wherein the ball grid array is at least substantially reflectively symmetrical across the central column.

6. The apparatus of claim 1, wherein each ball of the ball grid array positioned and configured to carry a data signal is located only diagonally adjacent to any other directly adjacent balls of the ball grid array positioned and configured to carry a data signal.

7. The apparatus of claim 1, wherein a perimeter of the ball grid array is at least substantially free of balls positioned and configured to carry data signals.

8. The apparatus of claim 1, wherein each ball of the ball grid array located laterally and longitudinally adjacent to each ball of the ball grid array positioned and configured to carry a data signal is configured to carry a voltage, connect to ground, or connect to a calibration circuit.

9. An apparatus, comprising:
a device substrate comprising semiconductor material and bond pads coupled with an active surface of the device substrate,
a package substrate secured to the device substrate, the package substrate configured to route signals to and from the bond pads, and
a ball grid array supported on, and electrically connected to, the package substrate, the ball grid array comprising an odd number of columns, such that the ball grid array comprises a central column having equal numbers of other columns on opposite sides of the central column,
wherein each ball of the ball grid array positioned and configured to carry a clock signal or a strobe signal is located in the central column of the ball grid array,
wherein a number of the balls of the ball grid array positioned and configured to carry a data signal is between about one-eighth and about one-fourth a number of the balls of the ball grid array positioned and configured to carry a voltage or connect to ground;
wherein a number of the balls of the ball grid array positioned and configured to carry a data signal is between about two-fifths about nine-tenths a number of the balls of the ball grid array positioned and configured to connect to input/output memory supply voltage.

10. The apparatus of claim 9, wherein a number of the balls of the ball grid array positioned and configured to carry a data signal is between about one-fourth and about one-half a number of the balls of the ball grid array positioned and configured to connect to core system voltage or to core system ground.

11. The apparatus of claim 9, wherein a total number of the balls of the ball grid array is between about 115 and about 120.

12. The apparatus of claim 9, wherein a number of the balls of the ball grid array positioned and configured to carry a data signal is about equal to a number of the balls of the ball grid array positioned and configured to connect to output driver voltage.

13. The apparatus of claim 9, wherein a number of the balls of the ball grid array positioned and configured to carry a data signal is about four times a number of the balls of the ball grid array positioned and configured to connect to word line voltage.

14. The apparatus of claim 1, wherein a number of the balls of the ball grid array positioned and configured to carry a data signal is between about one-eighth and about one-fourth a number of the balls of the ball grid array positioned and configured to carry a voltage or connect to ground and wherein a number of the balls of the ball grid array positioned and configured to carry a data signal is about four times a number of the balls of the ball grid array positioned and configured to connect to word line voltage.

15. An apparatus, comprising:
a first memory device, comprising:
a device substrate comprising a semiconductor material and bond pads coupled with an active surface of the device substrate;
a package substrate secured to the device substrate, the package substrate configured to route signals to and from the bond pads; and
a ball grid array supported on, and electrically connected to, the package substrate, the ball grid array comprising an odd number of columns, such that the ball grid array comprises a central column having equal numbers of other columns on opposite sides of the central column;
a second memory device; and
a printed circuit board interposed between, and secured to, each of the first memory device and the second memory device;
wherein each ball of the ball grid array of the first memory device positioned and configured to carry a clock signal or a strobe signal is located in the central column of the ball grid array;
wherein a total number of balls in the ball grid array is between about 115 and about 120.

16. The apparatus of claim 15, wherein the second memory device comprises a second ball grid array, the second ball grid array being rotationally mirrored across the printed circuit board relative to the ball grid array of the first memory device.

17. The apparatus of claim 16, wherein the printed circuit board comprises an electrical conductor located within the printed circuit board, the electrical conductor electrically connected to a first ball of the ball grid array of the first memory device positioned and configured to carry a clock signal or a strobe signal, the electrical conductor electrically connected to a second ball of the ball grid array of the second memory device positioned and configured to carry a clock signal or a strobe signal, the electrical conductor extending at least substantially perpendicular to a major surface of the printed circuit board over at least substantially an entire distance between the first ball and the second ball.

18. The apparatus of claim 16, wherein the device substrate of the first memory device is secured to the package substrate by a direct chip attach.

19. The apparatus of claim 18, wherein the first memory device is configured as a single die package, comprises a stack of device substrates interconnected to one another by through-silicon vias, or comprises a stack of device substrates interconnected to one another by wire bonds.

20. A system, comprising:
a central processing unit (CPU); and
at least one memory device connected to the CPU, the at least one memory device comprising:
  a device substrate comprising a semiconductor material and bond pads coupled with an active surface of the device substrate;
  a package substrate secured to the device substrate, the package substrate configured to route signals to and from the bond pads; and
  a ball grid array supported on, and electrically connected to, the package substrate, the ball grid array comprising an odd number of columns, such that the ball grid array comprises a central column having equal numbers of other columns on opposite sides of the central column;
wherein each ball of the ball grid array positioned and configured to carry a clock signal or a strobe signal is located in the central column of the ball grid array;
wherein a total number of balls in the ball grid array is between about 115 and about 120.

21. An apparatus, comprising:
a first memory device, comprising:
  a device substrate comprising a semiconductor material and bond pads coupled with an active surface of the device substrate;
  a package substrate secured to the device substrate, the device substrate secured to the package substrate by a direct chip attach, the package substrate configured to route signals to and from the bond pads; and
  a first ball grid array supported on, and electrically connected to, the package substrate, the first ball grid array comprising an odd number of columns, such that the first ball grid array comprises a central column having equal numbers of other columns on opposite sides of the central column;
a second memory device comprising a second ball grid array; and
a printed circuit board interposed between, and secured to, each of the first ball grid array of the first memory device and the second ball grid array of the second memory device, the second ball grid array of the second memory device being rotationally symmetrical across the printed circuit board relative to the first ball grid array of the first memory device;
wherein each ball of the first ball grid array of the first memory device positioned and configured to carry a clock signal or a strobe signal is located in the central column of the ball grid array;
wherein a total number of balls in the ball grid array is between about 115 and about 120.

* * * * *